(12) United States Patent
Mitama (10) Patent No.: US 6,175,728 B1
(45) Date of Patent: Jan. 16, 2001

(54) DIRECT CONVERSION RECEIVER CAPABLE OF CANCELING DC OFFSET VOLTAGES

(75) Inventor: Masataka Mitama, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/033,667

(22) Filed: Mar. 3, 1998

(30) Foreign Application Priority Data

Mar. 5, 1997 (JP) .................................................... 9-049522

(51) Int. Cl.[7] .............................. H04Q 7/20; H04L 25/06
(52) U.S. Cl. .......................................... 455/323; 375/319
(58) Field of Search ..................................... 455/323, 131, 455/141, 313, 315, 316, 318, 234.1, 240.1, 324, 207; 375/324, 319, 316, 344

(56) References Cited

U.S. PATENT DOCUMENTS

| | | | |
|---|---|---|---|
| 4,868,666 | * | 9/1989 | Azumi et al. .......................... 358/227 |
| 5,086,437 | * | 2/1992 | Tomita .................................... 375/98 |
| 5,175,749 | * | 12/1992 | Ficht et al. .............................. 375/76 |
| 5,416,803 | * | 5/1995 | Janer ..................................... 375/324 |
| 5,422,889 | * | 6/1995 | Sevenhans et al. .................. 370/95.3 |
| 5,617,451 | * | 4/1997 | Mimura et al. ....................... 375/340 |
| 5,663,988 | * | 9/1997 | Neustadt ............................... 375/319 |
| 5,710,998 | * | 1/1998 | Opas ..................................... 455/324 |
| 5,715,281 | * | 2/1998 | Bly ....................................... 375/344 |
| 5,724,653 | * | 3/1998 | Baker et al. .......................... 455/296 |
| 5,898,912 | * | 4/1999 | Heck et al. .......................... 455/234.2 |
| 5,986,598 | * | 11/1999 | Mittel ................................... 341/143 |

FOREIGN PATENT DOCUMENTS

| | | |
|---|---|---|
| 0 403 247 A2 | 6/1990 | (EP) . |
| 0 474 615 A2 | 9/1991 | (EP) . |
| 3-220823 | 9/1991 | (JP) . |
| WO 95/30275 | 11/1995 | (WO) . |

OTHER PUBLICATIONS

"A–D. D–A", Technical Survey, vol. 72, No. 12, pp. 1422–1429, 1989.

Iwata, A., "Over–sampling A–D •D–A conversion technology and its application to VLSI," *Technical Survey*, vol. 72, No. 12, pp. 1422–1429, Dec., 1989.

* cited by examiner

*Primary Examiner*—Nay Maung
*Assistant Examiner*—Joy Redmon
(74) *Attorney, Agent, or Firm*—McGuireWoods, LLP (57) ABSTRACT

A direct conversion receiver comprising mixers for mixing a received radio frequency signal and a local oscillation signal in frequency, a signal processing unit for converting the output signal of the mixers into a baseband signal, a delta-sigma modulator for detecting offset voltage from the output signal of the signal processing unit, a holding circuit for supplying offset canceling voltage for canceling the offset voltage, and a switch of supplying the output signal of the mixers to the delta-sigma modulator during a given period and supplying the offset canceling voltage sent from the holding circuit to the output side of the mixers.

18 Claims, 9 Drawing Sheets

DIRECT CONVERSION RECEIVER CAPABLE OF CANCELING DC OFFSET VOLTAGES

BACKGROUNDS OF THE INVENTION

1. Field of the Invention

The present invention relates to a direct conversion receiver, and more particularly to a direct conversion receiver known as a zero intermediate frequency (IF) receiver, for use in a portable telephone or other radio terminal devices.

2. Description of the Related Art

Recently, there have been rising the demands for downsizing, power consumption reduction, and cost reduction of a radio according to the prevalence of a portable telephone and other radio portable terminals. As a radio receiving method for realizing such demands, a direct conversion is an attractive architecture in radio design.

Figure 9:
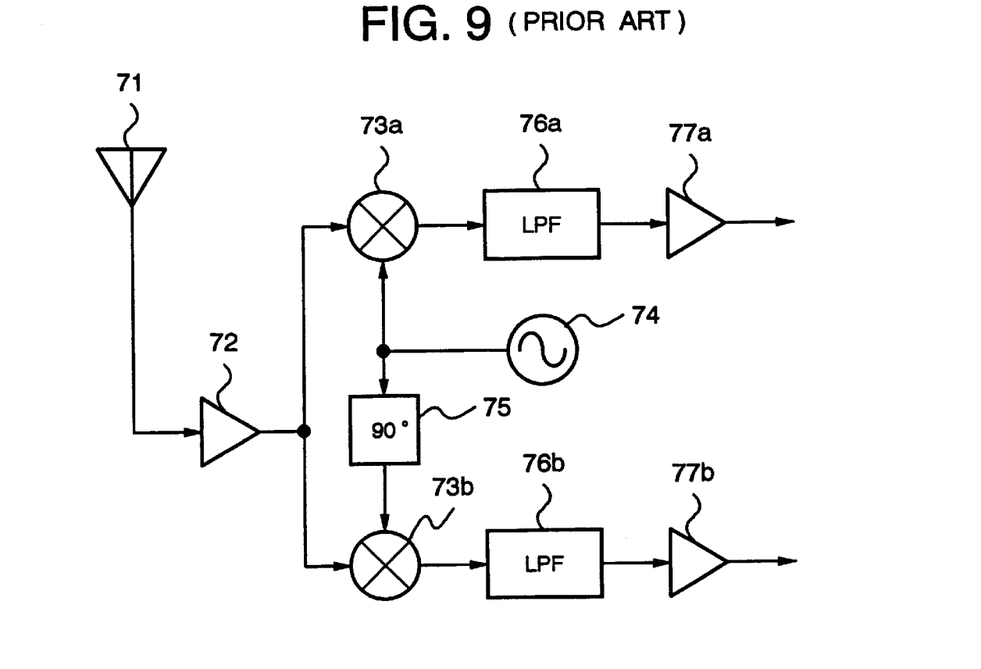
FIG. 9 is a block diagram showing a constitution of the conventional direct conversion receiver.

FIG. 9 shows a block diagram of the typical direct conversion receiver of this kind. With reference to FIG. 9, radio frequency signals are respectively supplied to quadrature mixers 73a and 73b through an antenna 71 and a radio frequency amplifier 72. One is multiplied by a local oscillation frequency of a local oscillator 74 in the mixer 73a, and the other is multiplied by the quadrature component of the local oscillation frequency in the mixer 73b, then to be supplied as I-component and Q-component. The quadrature component of the local oscillation frequency of the local oscillator 74 is generated by a 90 degrees phase shifter 75. The respective output signals of the mixers 73a and 73b consist of the sum component of input carrier frequency and local oscillation frequency and the difference component relative to the zero frequency (in case of ± expression of spectrum). LPFs 76a and 76b extract only the difference component with the zero frequency fixed as a reference (hereinafter, referred to as a zero frequency component). The extracted zero frequency component is further processed and demodulated by respective baseband amplifiers 77a and 77b.

The above-mentioned direct conversion method directly converts the input frequency into the baseband frequency. This corresponds to the case where the intermediate frequency is zero in the superheterodyne method. Because no image frequency component exists, no radio frequency filter is required. The baseband signal has such a form as turning back at the zero frequency and a LPF may be used as a channel filter. This makes IC fabrication easier compared with a channel filter of BPF type for use in the superheterodyne method. The direct conversion method has been recently recognized as a suitable circuit for 1 chip receiver because of requiring fewer external parts and making LSI fabrication easier compared with the superheterodyne method.

However, in order to use a direct conversion receiver in a radio system such as a portable telephone, it is necessary to eliminate dc (direct-current) offset voltage generally existing on the order of several mV to several 10 mV in a mixer, which is a serious practical problem. In order to get a good sensitivity in PDC (Personal Digital Cellular-phone) system and PHS (Personal Handy-phone System), the amplification degree of the baseband amplifiers 77a and 77b must be set at an extremely high value, for example, at several 10 dB. The baseband amplifiers, however, are saturated with the dc offset voltage occurring in the mixer as mentioned above, and never function as a receiver.

Figure 10:
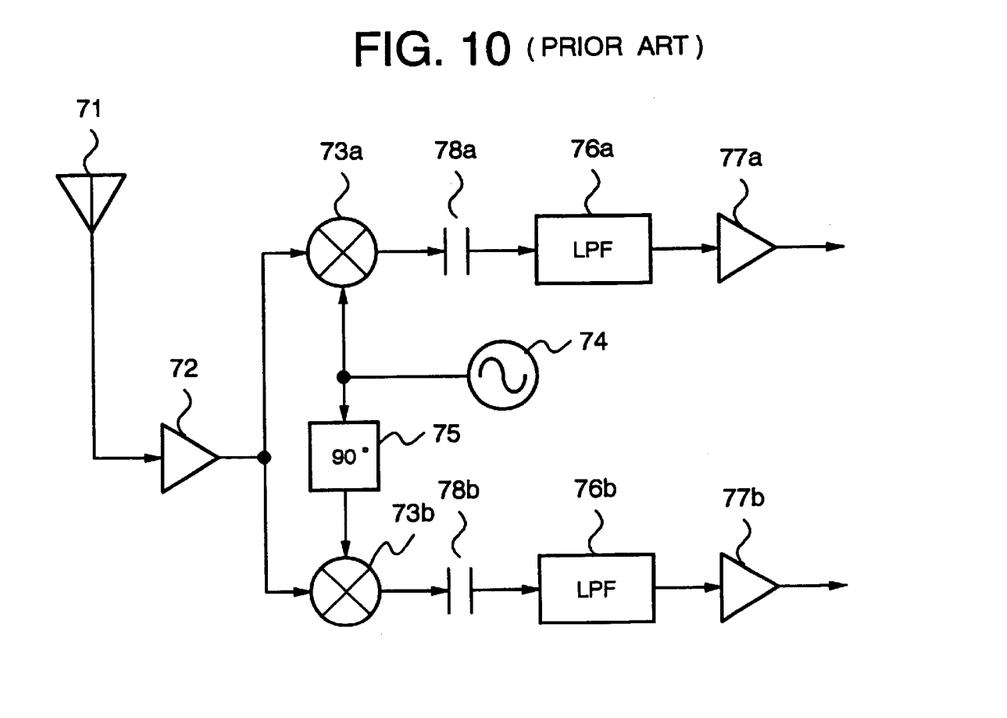
FIG. 10 is a block diagram showing another constitution of the conventional direct conversion receiver.

In order to solve the above problem, placing dc blocking condensers 78a and 78b behind the mixers 73a and 73b may be considered as illustrated in FIG. 10. This method, however, also blocks the zero frequency component and therefore this method can be applied only to the FSK modulation, for example, for use in a pager system. Even in this case, another additional circuit for shortening the charge/discharge time of a capacitor is generally needed, thereby increasing the circuit size disadvantageously, since a pager with an intermittent receiving function is generally designed in order to extend a battery life.

Figure 11:
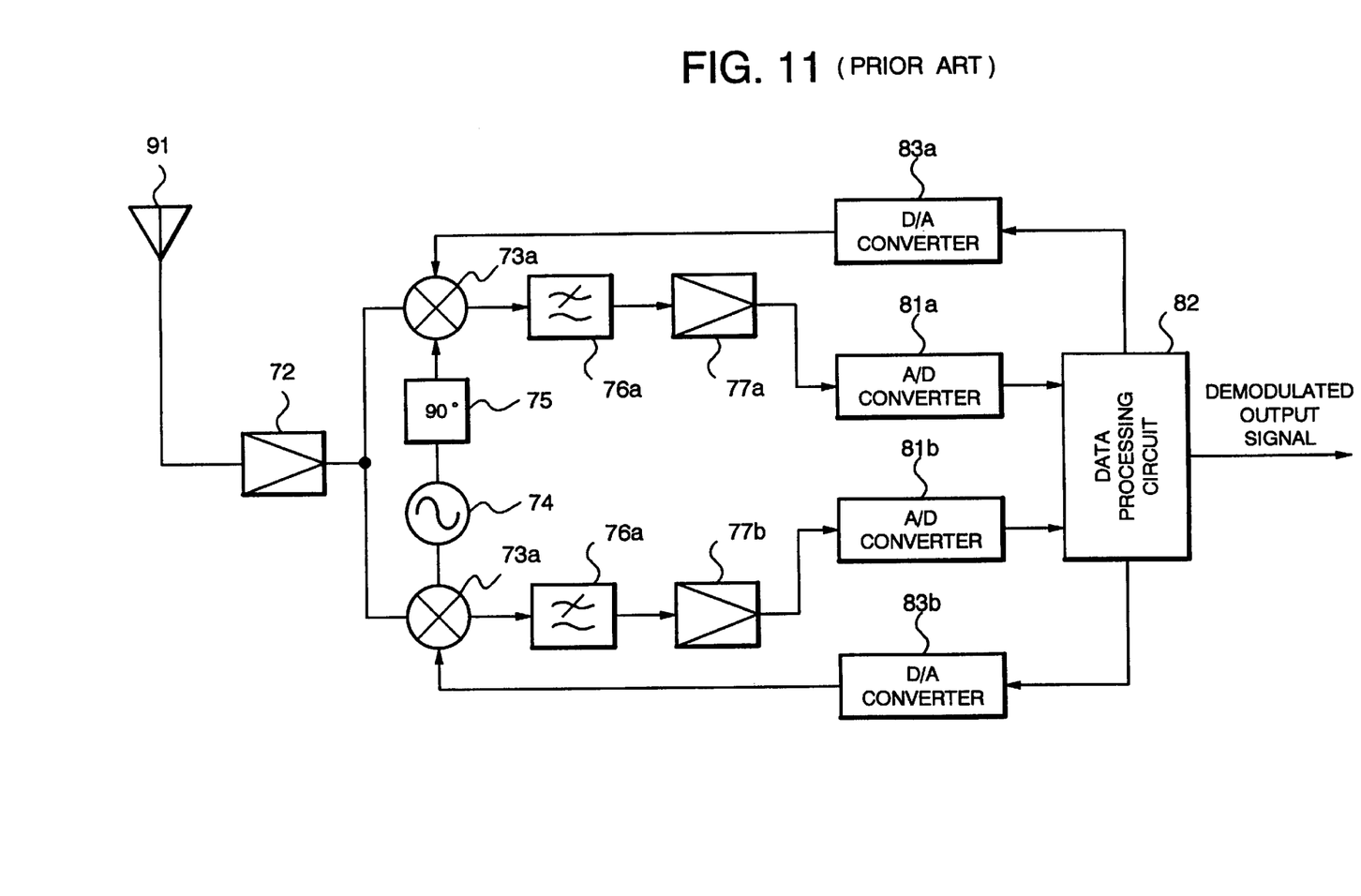
FIG. 11 is a block diagram showing further another constitution of the conventional direct conversion receiver.

Another conventional technique for eliminating dc offset voltage is disclosed in, for example, Japanese Patent Publication Laid-Open (Kokai) No. Heisei 3-220823, "Direct Conversion Receiver". The same publication describes a method of eliminating dc offset voltage by a negative feedback loop using AD and DA converters as illustrated in FIG. 11. In the block diagram of FIG. 11, the same reference numerals are respectively attached to the same components as those of the block diagram of FIG. 9.

In a direct conversion receiver as shown in FIG. 11, dc offset voltage is extracted from the output signals of the baseband amplifiers 77a and 77b by use of the AD converters 81a and 81b, and according to the extracted result, the dc offset voltage is suppressed by use of a data processing circuit 82 and DA converters 83a and 83b that are closed-loop controlling means.

This method is applicable to $\pi/4$QPSK modulation for use in PDC and PHS because of blocking off none of the zero frequency component in signal information. However, this method, by use of a closed-loop, is not effective in the change of offset voltage at the earlier time because of the restriction of the loop convergence time. More specifically, in case of controlling the average value of the offset voltage, for example, to be zero during a long period of one second, some effects can be expected to an extent. However, it is not effective in the offset voltage such as would vary at a speed of time slot of the digital portable telephone system (for example, 0.625 msec in PHS). Further, it is defective in increasing the circuit size because of using AD and DA converters.

SUMMARY OF THE INVENTION

An object of the present invention is to provide a direct conversion receiver with an offset voltage canceling circuit capable of canceling finest offset voltages at a high speed.

Another object of the present invention is, in addition to the above object, to provide a direct conversion receiver with reduced size compared with conventional circuits and suitable for a portable telephone or the other portable radio terminal device.

According to the first aspect of the invention, a direct conversion receiver comprises frequency mixing means for mixing a received radio frequency signal and a local oscillation signal in frequency, signal converting means for converting the output signal of the frequency mixing means into a baseband signal, offset voltage detecting means for detecting offset voltage from the output signal of the signal converting means, offset canceling means for supplying offset canceling voltage for canceling the offset voltage in the output signal of the frequency mixing means, correspondingly to the offset voltage detected by the offset voltage detecting means, and switching means for supplying the output signal of the frequency mixing means to the offset voltage detecting means during a given period based on a predetermined rule, and supplying the offset canceling voltage sent from the offset canceling means to the output side of the frequency mixing means during a period other than the given period.

In the preferred construction, when it is applied to a communication system of Time Division Multiplex Access method, the switching means switches connection so as to supply the output signal of the frequency mixing means to the offset voltage detecting means during a period other than an assigned time slot of the present receiver, or so as to supply the offset canceling voltage sent from the offset canceling means to the output side of the frequency mixing means during a period of the assigned time slot of the present receiver.

In the preferred construction, when it is applied to a communication system of Frequency Division Multiplex Access method, the switching means switches connection so as to supply the output signal of the frequency mixing means to the offset voltage detecting means during a period corresponding to a pilot signal part of a received frame, or so as to supply the offset canceling voltage sent from the offset canceling means to the output side of the frequency mixing means during the other period.

In the preferred construction, the offset voltage detecting means comprises delta-sigma modulating means receiving the output of the frequency mixing means for delta-sigma modulation, and averaging means for averaging the output signal delta-sigma modulated by the delta-sigma modulating means.

In the preferred construction, the offset voltage detecting means comprises delta-sigma modulating means receiving the output of the frequency mixing means for delta-sigma modulation, and averaging means for averaging the output signal delta-sigma modulated by the delta-sigma modulating means,
the delta-sigma modulating means being a first order or more delta-sigma modulator.

In the preferred construction, the offset voltage detecting means comprises delta-sigma modulating means receiving the output of the frequency mixing means for delta-sigma modulation, and averaging means for averaging the output signal delta-sigma modulated by the delta-sigma modulating means,
the delta-sigma modulating means being a MASH typed delta-sigma modulator.

In another preferred construction, the offset canceling means inverts the offset voltage detected by the offset voltage detecting means to obtain offset canceling voltage and holds the obtained offset canceling voltage.

In another preferred construction, the offset voltage detecting means comprises delta-sigma modulating means receiving the output of the frequency mixing means for delta-sigma modulation, and averaging means for averaging the output signal delta-sigma modulated by the delta-sigma modulating means, and
the offset canceling means inverts the voltage supplied from the averaging means to obtain offset canceling voltage and holds the obtained offset canceling voltage.

In another preferred construction, one or more stage baseband amplifiers are disposed between the frequency mixing means and the signal converting means,
the output side of any baseband amplifier before the rear baseband amplifier being arranged to be connected to the switching means for extracting the output signal to be supplied to the offset voltage detecting means and supplying the offset canceling voltage.

According to the second aspect of the invention, a direct conversion receiver comprises
frequency converting means for mixing a received radio frequency signal and a local oscillation signal in frequency and converting it into a baseband signal,
offset voltage detecting means for detecting offset voltage from the output signal of the frequency converting means during a given period based on a predetermined rule, and
offset canceling means for canceling the offset voltage in the output signal of the frequency converting means during a period other than the given period, correspondingly to the offset voltage detected by the offset voltage detecting means.

In the preferred construction, when it is applied to a communication system of Time Division Multiplex Access method, the offset voltage detecting means detects offset voltage during a period other than an assigned time slot of the present receiver, and
the offset canceling means supplies the offset canceling voltage to the output side of the frequency converting means during a period of the assigned time slot of the present receiver.

In the preferred construction, when it is applied to a communication system of Frequency Division Multiplex Access method, the offset voltage detecting means detects offset voltage during a period corresponding to a pilot signal part of a received frame,
the offset canceling means supplies the offset canceling voltage sent from the offset canceling means to the output side of the frequency converting means during the other period.

In another preferred construction, the offset voltage detecting means fetches the output signal of the frequency converting means through one or more stage baseband amplifiers and detects offset voltage of the obtained output signal.

According to the third aspect of the invention, a direct conversion receiver comprises
frequency mixing means for mixing a received radio frequency signal and a local oscillation signal in frequency,
signal converting means for converting the output signal of the frequency mixing means into a baseband signal,
offset voltage detecting means for detecting offset voltage from the output signal of the signal converting means,
offset canceling means for supplying offset canceling voltage for canceling offset voltage in the output signal of the frequency mixing means, correspondingly to the offset voltage detected by the offset voltage detecting means, so as to overlap the output signal of the frequency mixing means, and
switching means for blocking the supply of the output signal of the offset voltage detecting means to the offset canceling means during a given period based on a predetermined rule, and supplying the output signal of the offset voltage detecting means to the offset canceling means during a period other than the given period.

In the preferred construction, when it is applied to a communication system of Time Division Multiplex Access method, the switching means blocks the supply of the output signal of the offset voltage detecting means to the offset canceling means during a period other than an assigned time slot of the present receiver, and supplies the output signal of the offset voltage detecting means to the offset canceling means during a period of the assigned time slot of the present receiver.

In the preferred construction, when it is applied to a communication system of Frequency Division Multiplex Access method, the switching means blocks the supply of the output signal of the offset voltage detecting means to the offset canceling means during a period corresponding to a pilot signal part of a received frame, and supplies the output signal of the offset voltage detecting means to the offset canceling means during the other period.

In another preferred construction, the offset voltage detecting means comprises delta-sigma modulating means receiving the output of the frequency mixing means for delta-sigma modulation, and averaging means for averaging the output signal delta-sigma modulated by the delta-sigma modulating means, the delta-sigma modulating means being a first or more delta-sigma modulator.

In another preferred construction, the offset voltage detecting means comprises delta-sigma modulating means receiving the output of the frequency mixing means for delta-sigma modulation, and averaging means for averaging the output signal delta-sigma modulated by the delta-sigma modulating means, the delta-sigma modulating means being a MASH typed delta-sigma modulator.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
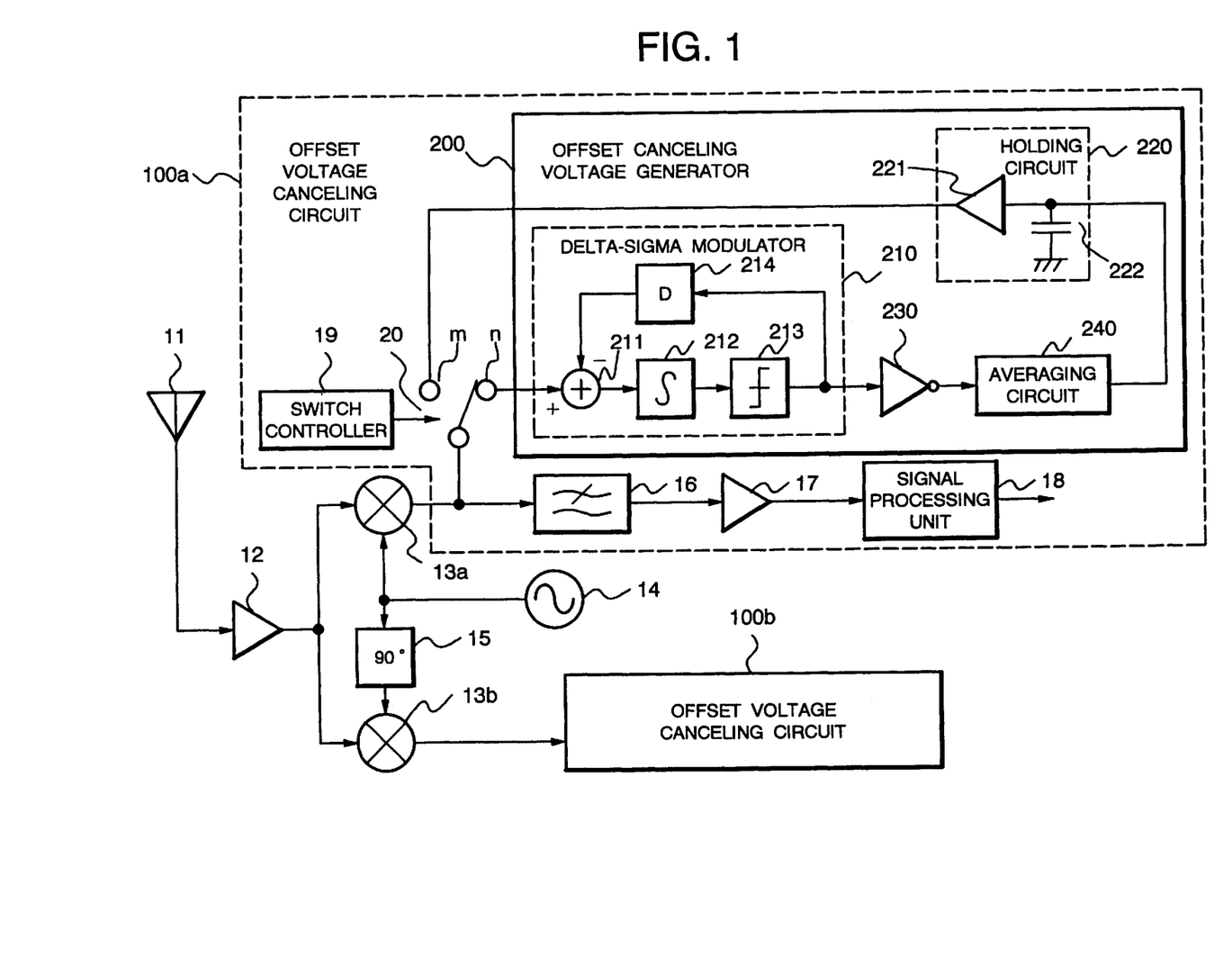
FIG. 1 is a block diagram showing a constitution of a direct conversion receiver according to an embodiment of the present invention.

FIG. 1 is a block diagram showing a constitution of a direct conversion receiver according to an embodiment of the present invention. The following description will be made, by way of example, in case of Time Division Multiplex Access (TDMA) method for use in PHS, PDC, or the like. With reference to FIG. 1, RF (radio frequency) signals received through an antenna 11, passing through a high frequency amplifier 12, are respectively quadrature-converted by mixers 13a and 13b, in the direct conversion receiver in the embodiment. Therefore, a local oscillator 14 and a 90 degrees phase shifter 15 are provided therein and the local oscillation frequency and the quadrature component thereof are respectively supplied to the mixers 13a and 13b. The output signals of the mixers 13a and 13b are respectively supplied to offset voltage canceling circuits 100a and 100b, so to be processed therein. FIG. 1 shows the concrete example of the offset voltage canceling circuit 100a only for I-component supplied from the mixer 13a, while the description and the illustration of the offset voltage canceling circuit 100b for Q-component is omitted there because of having the same constitution and function as the offset voltage canceling circuit 100a. FIG. 1 shows only the characteristic components of this embodiment, while the description of other general components is omitted there.

The output signal of the mixer 13a is divided into two; one is received by a signal processing unit 18 via an LPF 16 and a baseband amplifier 17, where it is subject to the baseband signal processing, and the other is received by an offset canceling voltage generator 200 through the contact "n" of a switch 20. The offset canceling voltage generator 200 includes a delta-sigma modulator 210 for detecting offset voltage, an inverter 230 for inverting the output signal modulated by the delta-sigma modulator 210, an averaging circuit 240 for averaging the output signal of the inverter 230, and a holding circuit 220 for holding the output signal of the averaging circuit 240. The output signal of the holding circuit 220 is supplied to the mixer 13a through the contact "m" of the switch 20. The switch 20 is controlled by a switch controller 19.

The divided output of the mixer 13a received by the delta-sigma modulator 210 is applied to the positive-phase input of the subtracter 211 and the subtracted output of the subtracter 211 is supplied to a one-bit quantizer 213 via an integrator 212. The output signal of the one-bit quantizer 213 is applied to the negative-phase input of the subtracter 211 via a one-sample delaying unit 214.

Figure 2:
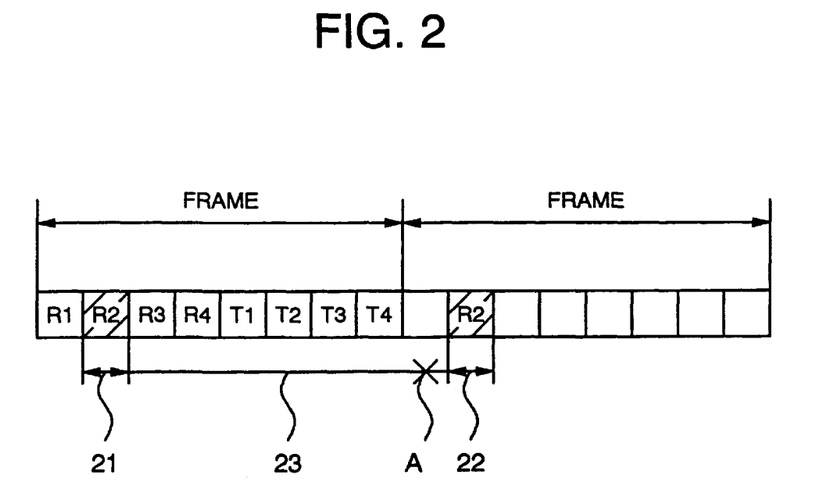
FIG. 2 is a view showing a constitution example of a frame in TDMA method.

Switching control of the switch 20 by the switch controller 19 will be performed as follows. Since the embodiment adopts the TDMA method as mentioned above, when considering the case of, for example, a terminal No. 2 (indicated as $R_2$), with reference to one example of a slot structure of TDMA as shown in FIG. 2, the radio frequency amplifier 12 is activated into a data receiving state in a period of a receiving slot 21 and the switch 20 is connected to the contact "m". The radio frequency amplifier 12 is in a non-activated sleeping state during the period 23 after the end of the receiving slot 21 before the start of the receiving slot 22 of the next frame, and the switch 20 is connected to the contact "n".

The periods 21 and 22 in FIG. 2 are offset voltage canceling periods and the period 23 is an offset voltage detecting period. The delta-sigma modulator 210 is used to detect the offset voltage in the offset voltage detecting period. The principal of the operation has been described in detail, for example, in "The Transactions of the Institute of Electronics, Information and Communication Engineers", pp. 1422 to 1429, No. 12, Vol. 72 published in December, 1989. According to the same article, the delta-sigma modulator 210 modulates the input signal into a signal train of one-bit oversampling frequency having a "+a" or "−a" value (where "a" is a constant). After passing through the delta-sigma modulator 210, the offset voltage appearing in the mixer output during the period 23 is converted into one-bit digital signal like "±a" having a positive or negative value. The digital signal is further inverted in sign by the inverter 230 and averaged by the averaging circuit 240. Thus, the inverted value of the direct offset voltage sign of the mixer 13a during the period 23 can be obtained. This value is held by the holding circuit 220 consisting of a buffer 221 and a condenser 222. Next, in the period 22, the direct offset voltage of the mixer 13a is cancelled according to the inverted value of the holding circuit 220 through the switch 20. Therefore, the offset voltage will be cancelled when receiving the data.

As is apparent from the above description, in the offset voltage canceling circuit 100 of the embodiment, the offset canceling voltage generator 200 and the switch 20 form one open loop, and therefore the canceling operation in the open loop is speedy compared with in the closed-loop. For example, the offset canceling operation can be performed in the immediate vicinity of the receiving slot, as the point "A" indicated in FIG. 2. Therefore, even if the offset voltage varies on the order of time slot, the canceling operation can be performed minutely, thereby suppressing the deterioration of the receiving characteristics at a minimum.

Though the above description has been made in the case where the offset voltage is a constant, if the offset voltage varies temporally, the inverted output signal of the average value of the varying voltage can be obtained at the contact "m" of the switch 20.

Figure 3:
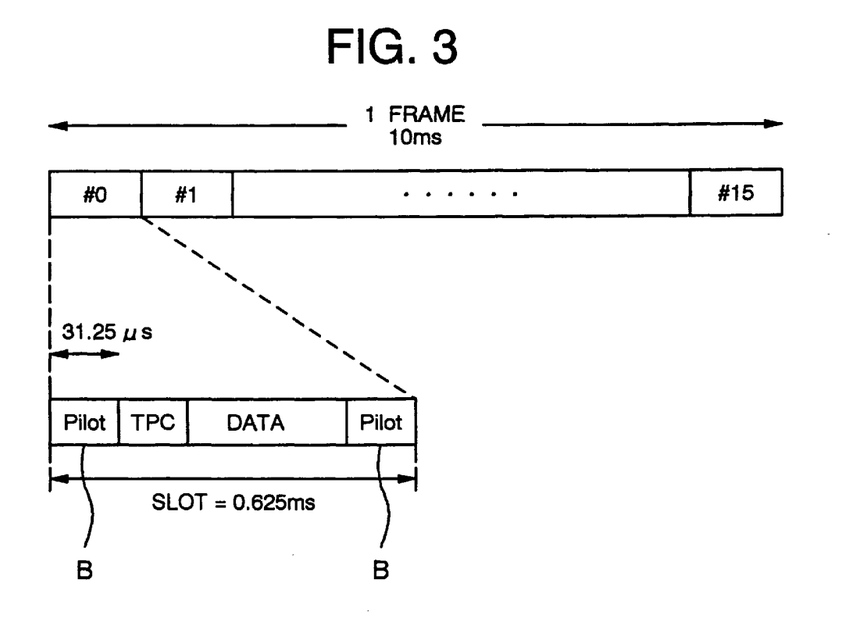
FIG. 3 is a view showing a constitution example of a frame in FDMA method.

The description has been made in the case of the TDMA method with reference to FIG. 2. In the case of a direct conversion receiver of FDMA (Frequency Division Multiplex Access) method receiving a signal sequentially, the same effect as in the above-mentioned TDMA method can be realized by setting the non-receiving state at a minimum necessary to detect offset voltage for the purpose of offset canceling. The non-receiving state can be obtained, for example, by turning off the radio frequency amplifier 12. FIG. 3 shows an example of a radio frame in the FDMA method. In FIG. 3, the timing of turning off the radio frequency amplifier 12 may be decided by selecting a predetermined period of the pilot signal (pilot) of the receiving frame shown as "B" in FIG. 3. Namely, the switch 20 is controlled toward the contact "n" side during only the selected period, and in the other period, it is controlled toward the contact "m" side to do offset voltage canceling. The timing of turning off the radio frequency amplifier 12 is not always selected in all the pilot signals, but the timing thereof may be selected by thinning out it intermittently.

Generally, assuming that the full scale of an AD converter is, for example, 1 V, the AD converter having 10 bits resolution (60 dB) or the more is needed in order to detect a voltage of several mV corresponding to the offset voltage of a mixer. In the example of FIG. 1, if setting the value "a" in the modulation processing by the delta-sigma modulator 210, for example, at 100 mV, an AD converter having 40 db or 7 bits resolution would be enough. The signal to noise ratio, S/N of the first delta-sigma modulator can be expressed as $$S/N=(9\pi/2) \cdot \{f_s/(2\pi \cdot f_b)\}^3$$

where, $f_s$ is the sampling frequency and $f_b$ is the signal band. Therefore, the resolution of S/N=40 dB can be easily obtained by use of the first delta-sigma modulator 210 shown in FIG. 1.

The offset canceling voltage generator 200 shown in FIG. 1 adopts the first delta-sigma modulator 210. Otherwise, if adopting a second or further-order delta-sigma modulator or a delta-sigma modulator of MASH (Multi Stage Noise Shaping) type, smaller offset voltage canceling and high-speed operation could be expected although the circuit becomes complicated.

Figure 4:
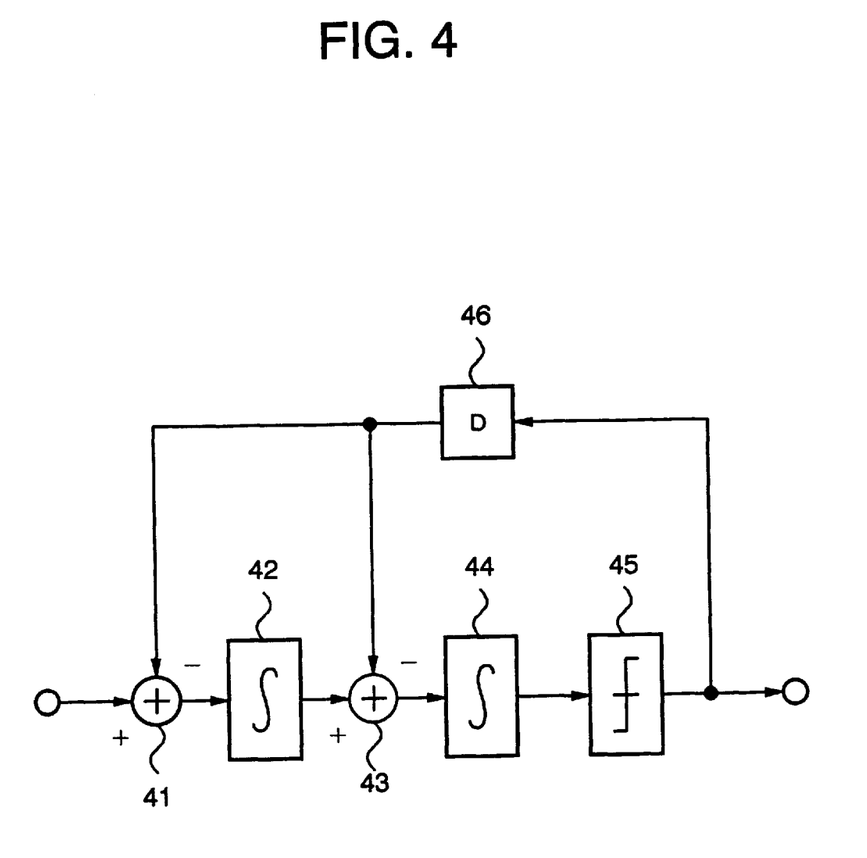
FIG. 4 is a block diagram showing a constitution example of a second delta-sigma modulator.

FIG. 4 is a circuit of a second-order delta-sigma modulator. The circuitry of the delta-sigma modulator shown in FIG. 4 is disclosed in "The Transactions of the Institute of Electronics, Information and Communication Engineers" as mentioned above. With reference to FIG. 4, the second-order delta-sigma modulator comprises subtracters 41 and 43, integrators 42 and 44, a one-bit quantizer 45, and a one-sample delaying unit 46. The input signal is applied to the positive-phase input of the subtracter 41, the output signal of the subtracter 41, passing through the integrator 42, is applied to the positive-phase input of the subtracter 43, and the output signal of the subtracter 43, passing through the integrator 44, is supplied to the one-bit quantizer 45. The output signal of the one-bit quantizer 45, after being delayed by one-sample delaying unit 46, is applied to the negative-phase input of the subtracters 41 and 43.

Figure 5:
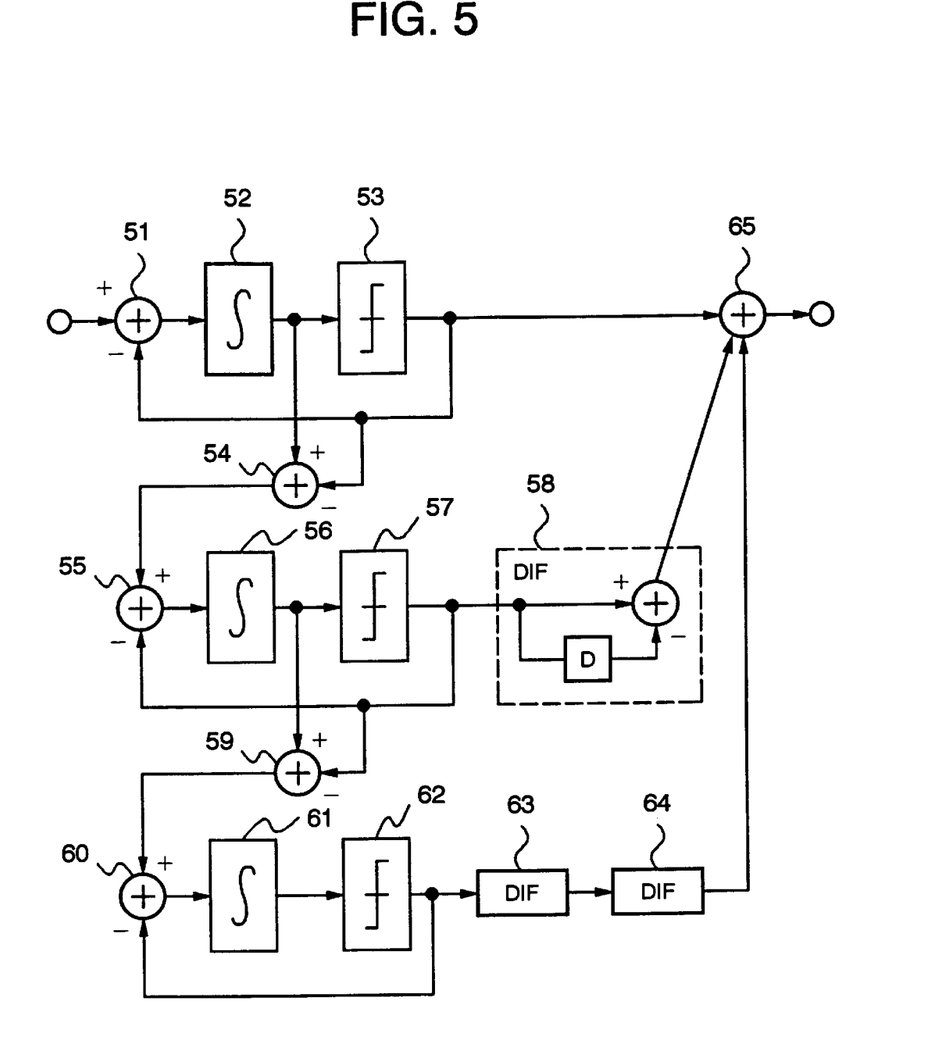
FIG. 5 is a block diagram showing a constitution example of a MASH typed delta-sigma modulator of three stages.

FIG. 5 is a circuit of a MASH typed delta-sigma modulator of three-stages. The circuitry of the delta-sigma modulator shown in FIG. 5 is disclosed in "The Transactions of the Institute of Electronics, Information and Communication Engineers" as mentioned above. With reference to FIG. 5, the MASH typed AD converter comprises subtracters 51, 54, 55, 59, and 60, integrators 52, 56, and 61, one-bit quantizers 53, 57, and 62, differentiators 58, 63, and 64, and an adder 65. The input signal is applied to the positive-phase input of the subtracter 51, passing through the integrator 52 and entering the one-bit quantizer 53. The output signal of the integrator 52 is applied to the positive-phase input of the subtracter 54. The output signal of the one-bit quantizer 53 is applied to the negative-phase inputs of the subtracters 51 and 54 and supplied to the adder 65. The output signal of the subtracter 54 is applied to the positive-phase input of the subtracter 55, and passing through the integrator 56, it is supplied to the one-bit quantizer 57. The output signal of the integrator 56 is applied to the positive-phase input of the subtracter 59. The output signal of the one-bit quantizer 57 is applied to the negative-phase inputs of the subtracters 55 and 59 and supplied to the adder 65 through the integrator 58. The output signal of the subtracter 59 is applied to the positive-phase input of the subtracter 60 and supplied to the one-bit quantizer 62 passing through the integrator 61. The output signal of the one-bit quantizer 62 is applied to the negative-phase input of the subtracter 60 and supplied to the adder 65 after passing through the differentiators 63 and 64 provided in series.

Figure 6:
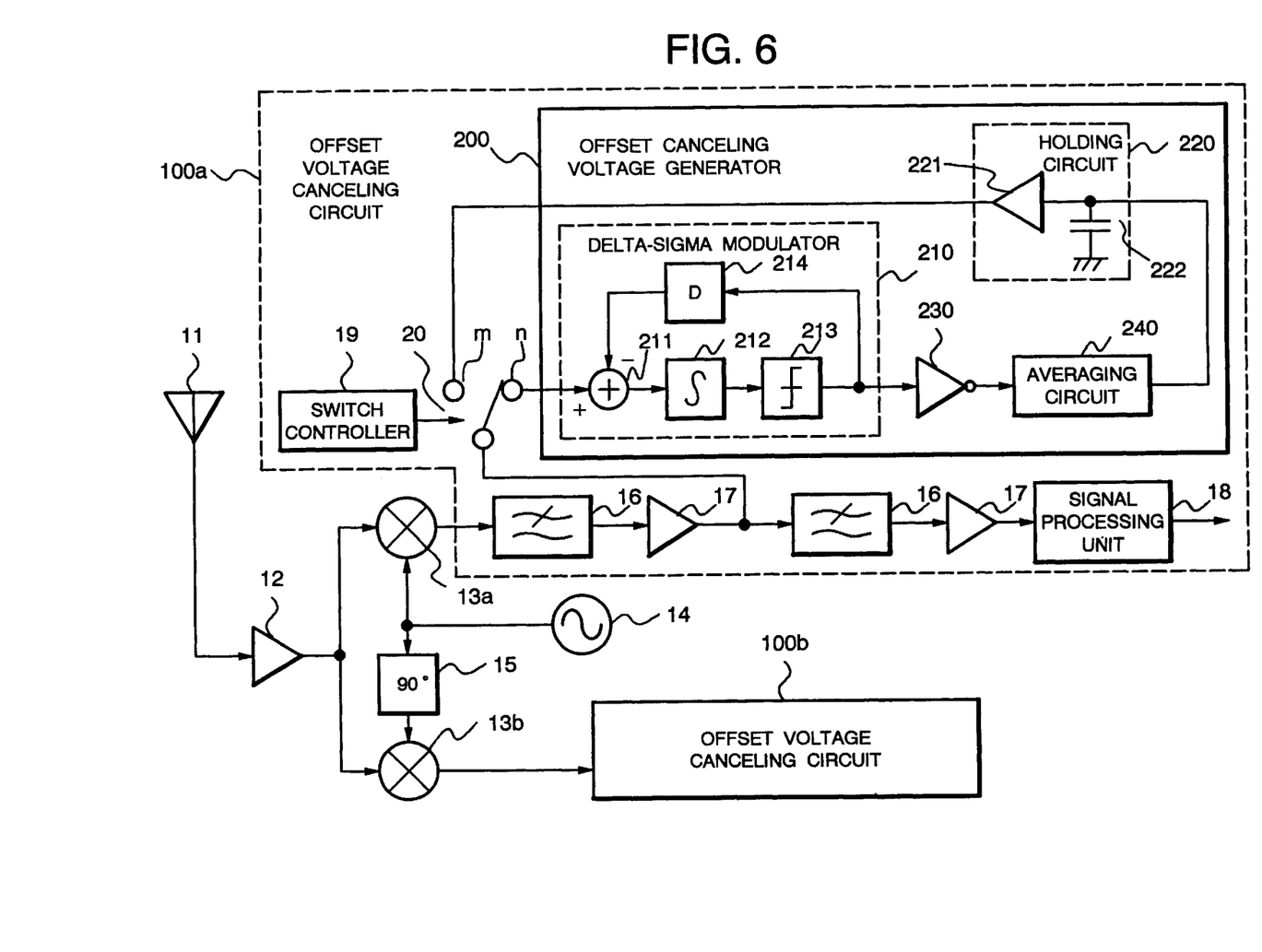
FIG. 6 is a block diagram showing a constitution of a direct conversion receiver according to another embodiment of the present invention.

FIG. 6 is a block diagram showing a configuration of a direct conversion receiver according to another embodiment of the present invention. With reference to FIG. 6, the direct conversion receiver of the embodiment is configured in the same way as that of first embodiment as shown in FIG. 1, except that this embodiment is provided with two stages of process of receiving an output signal of the mixer 13a or 13b to process it and supplying it to the signal processing unit 18. In FIG. 6, the same reference numerals are respectively attached to the same components as those shown in FIG. 1. FIG. 6 shows only the characteristic components of this embodiment and the description of other general components is omitted.

This embodiment doesn't perform the offset detection directly from the output signal of the mixer 13a or 13b but performs the offset detection from the output signal of the baseband amplifier 22 after once passing through the processing by the LPF 21 and the baseband amplifier 22. Therefore, an LPF 23 and a baseband amplifier 24 for a second stage are provided so as to process the output signal of the baseband amplifier 21, and the output signal of the baseband amplifier 21 is connected to the switch 20. Further, it may be provided with three or more stages of the combination of the LPF and baseband amplifier, and offset voltage detection and cancellation may be performed in any stage.

Figure 7:
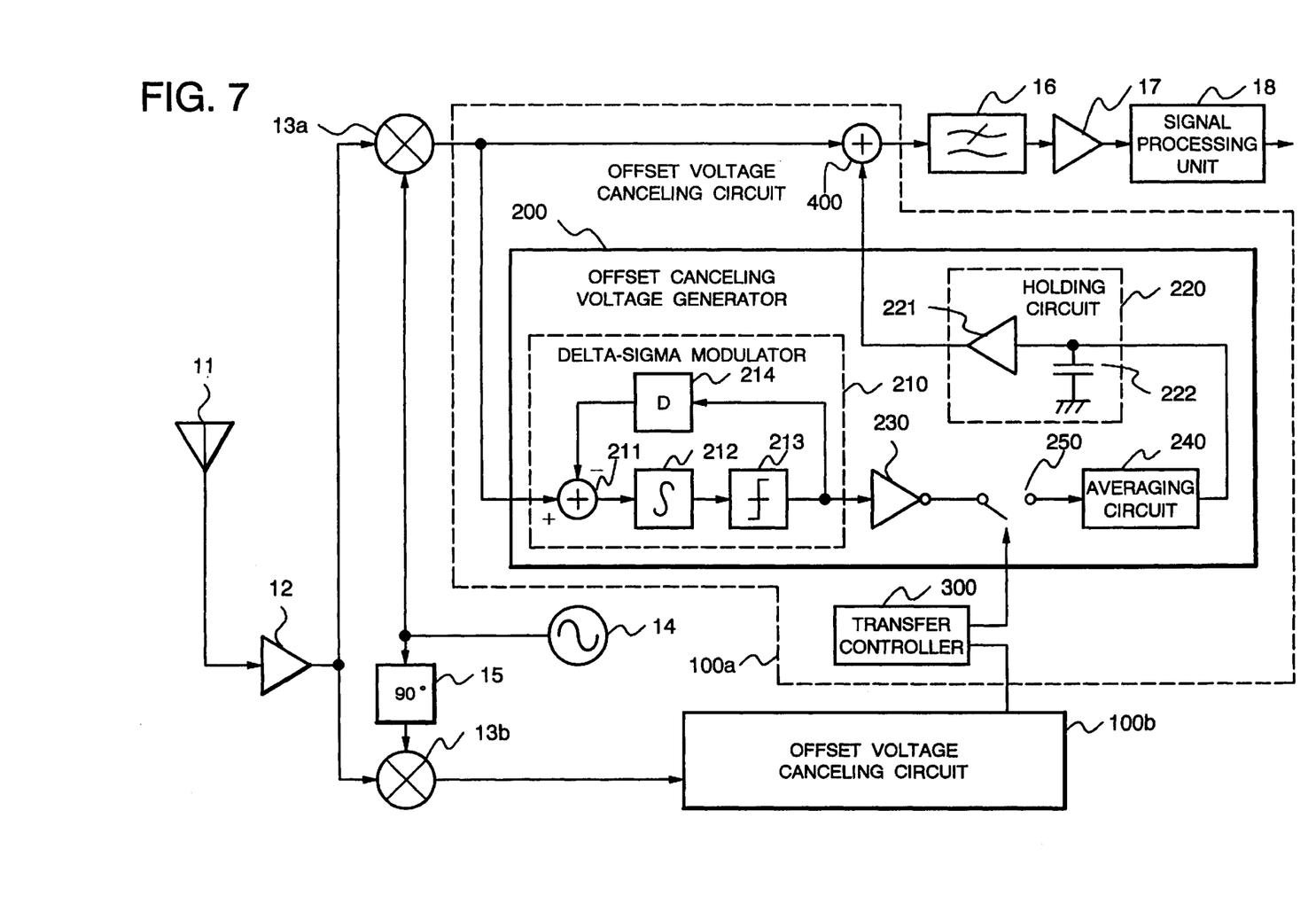
FIG. 7 is a block diagram showing a constitution of a direct conversion receiver according to further another embodiment of the present invention.

FIG. 7 is a block diagram showing a configuration of a direct conversion receiver according to further another embodiment of the present invention. With reference to FIG. 7, in the direct conversion receiver of the embodiment, the output signal of the mixer 13a is divided into two; one is supplied to an adder 400 as it is, and the other is supplied to an offset canceling voltage generator 200.

The offset canceling voltage generator 200 comprises a delta-sigma modulator 210 for detecting offset voltage, an inverter 230 for inverting the modulated output signal by the delta-sigma modulator 210, an averaging circuit 240 for averaging the output signal of the inverter 230, a holding circuit 220 for holding the output signal of the averaging circuit 240, and a transfer switch 250 for controlling the transfer of the output signal of the inverter 230 to the averaging circuit 240.

The transfer switch 250 is controlled by a transfer controller 300 in a way of permitting the transfer of the output signal of the inverter 230 or blocking it.

The transfer controller 300 controls the transfer switch 250 as below. Namely, in the period of the receiving slot 21 shown in FIG. 2, the radio frequency amplifier 12 is activated into a data receiving state, and the transfer switch 250 breaks off (OFF) the connection between the inverter 230 and the averaging circuit 240. In the period 23 after the end of the receiving slot 21 before the start of the receiving slot 22 of the next frame, the transfer switch 250 turns on (ON) the connection between the inverter 230 and the averaging circuit 240. The above-mentioned relationship will be shown in FIG. 8.

Figure 8:
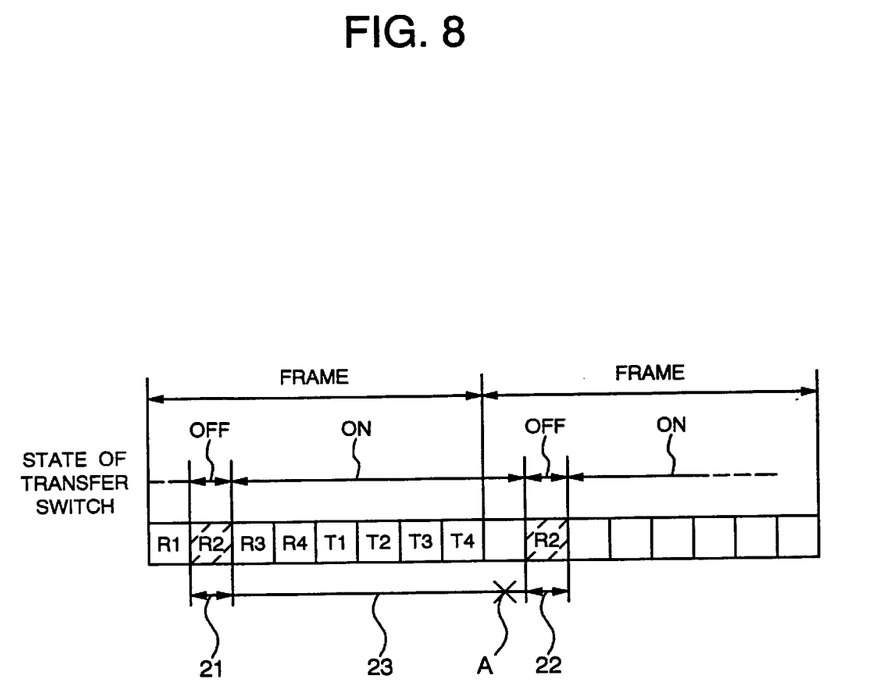
FIG. 8 is a constitution example of a frame in the TDMA method for use in describing the operation of the embodiment of FIG. 7

In FIG. 8, the periods 21 and 22 are offset voltage canceling periods and the period 23 is an offset voltage detecting period. Detection of the offset voltage during the offset voltage detecting period is performed in the same way as in the case of the first embodiment shown in FIG. 1. Therefore, during the periods 21 and 22, the offset canceling voltage of opposite polarity to the offset voltage of the mixer 13a or 13b is supplied to the holding circuit 220. Since the transfer switch 250 turns OFF in the receiving slot during the periods 21 and 22 as mentioned above, the offset canceling voltage having been detected just before the receiving slot is applied to the adder 400. Therefore, in the output signal of the adder 400, the offset voltage is cancelled and only the baseband signal is obtained.

As is apparent from the above description, the offset voltage canceling circuit 100a shown in FIG. 3 also forms an open loop.

Though the above description has been made in the case of the TDMA method, it can be applied to the FDMA method similarly to the other embodiments. Further, the delta-sigma modulator 300 may have a configuration of a delta-sigma modulator of several stages as shown in FIG. 4, or a MASH typed delta-sigma modulator as shown in FIG. 5, depending on the necessity.

As set forth hereinabove, since the direct conversion receiver of the present invention forms an open transfer loop for canceling the offset voltage of a mixer, it is effective in speeding up the canceling operation compared with the closed-loop configuration in the conventional technique.

Further, according to the present invention, since the detection of small offset voltage can be possible by a simple structure, it can achieve the downsizing and cost-reduction of a direct conversion receiver, which is preferable for a portable telephone or other portable radio terminal device.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A direct conversion receiver comprising:

frequency mixing means for mixing a received radio frequency signal and a local oscillation frequency signal;

signal converting means for converting an output signal of said frequency mixing means into a baseband signal;

offset voltage detecting means for detecting offset voltage from an output signal of said signal converting means;

offset canceling means for supplying an offset canceling voltage for canceling the offset voltage in the output signal of said frequency mixing means, correspondingly to the offset voltage detected by said offset voltage detecting means; and switching means for supplying the output of said frequency mixing means to said offset voltage detecting means during a given period, and supplying the offset canceling voltage sent from said offset canceling means to the output side of said frequency mixing means during a period other than the given period.

2. A direct conversion receiver as set forth in claim 1, wherein when it is applied to a communication system of Time Division Multiplex Access method, said switching means switches connection so as to supply the output signal of said frequency mixing means to said offset voltage detecting means during a period other than an assigned time slot of the present receiver, or so as to supply the offset canceling voltage sent from said offset canceling means to the output side of said frequency mixing means during a period of the assigned time slot of the present receiver.

3. A direct conversion receiver as set forth in claim 1, wherein when it is applied to a communication system of Frequency Division Multiplex Access method,
said switching means switches connection so as to supply the output signal of said frequency mixing means to said offset voltage detecting means during a period corresponding to a pilot signal part of a received frame, or so as to supply the offset canceling voltage sent from said offset canceling means to the output side of said frequency mixing means during the other period.

4. A direct conversion receiver as set forth in claim 1, wherein
said offset voltage detecting means comprising
delta-sigma modulating means receiving the output of said frequency mixing means for delta-sigma modulation, and
averaging means for averaging the output signal delta-sigma modulated by said delta-sigma modulating means.

5. A direct conversion receiver as set forth in claim 1, wherein
said offset voltage detecting means comprising
delta-sigma modulating means receiving the output of said frequency mixing means for delta-sigma modulation, and
averaging means for averaging the output signal delta-sigma modulated by said delta-sigma modulating means,
said delta-sigma modulating means being a first order or more delta-sigma modulator.

6. A direct conversion receiver as set forth in claim 1, wherein
said offset voltage detecting means comprising
delta-sigma modulating means receiving the output of said frequency mixing means for delta-sigma modulation, and
averaging means for averaging the output signal delta-sigma modulated by said delta-sigma modulating means,
said delta-sigma modulating means being a MASH typed delta-sigma modulator.

7. A direct conversion receiver as set forth in claim 1, wherein
said offset canceling means
inverts the offset voltage detected by said offset voltage detecting means to obtain offset canceling voltage and holds the obtained offset canceling voltage.

8. A direct conversion receiver as set forth in claim 1, wherein:
said offset voltage detecting means comprising
delta-sigma modulating means receiving the output of said frequency mixing means for delta-sigma modulation, and
averaging means for averaging the output signal delta-sigma modulated by said delta-sigma modulating means; and
said offset canceling means
inverts the voltage supplied from said averaging means to obtain offset canceling voltage and holds the obtained offset canceling voltage.

9. A direct conversion receiver as set forth in claim 1, wherein
one or more stage baseband amplifiers are disposed between said frequency mixing means and said signal converting means,
the output side of any baseband amplifier before the rear baseband amplifier being arranged to be connected to said switching means for extracting the output signal to be supplied to said offset voltage detecting means and supplying the offset canceling voltage.

10. A direct conversion receiver comprising:
frequency converting means for mixing a received radio frequency signal and a local oscillation frequency signal;
signal converting means for converting an output signal of said frequency converting means into a baseband signal;
offset voltage detecting means for detecting an offset voltage from the output signal of said frequency converting means during a given period; and
offset canceling means for canceling the offset voltage in the output signal of said frequency converting means during a period other than the given period, correspondingly to the offset voltage detected by said offset voltage detecting means,
wherein it is applied to a communication system of Time Division Multiplex Access method,
said offset voltage detecting means detects offset voltage during a period other than an assigned time slot of a present receiver, and
said offset canceling means supplies the offset canceling voltage to the output side of said frequency converting means during a period of the assigned time slot of the present receiver.

11. A direct conversion receiver comprising:
frequency converting means for mixing a received radio frequency signal and a local oscillation frequency signal;
signal converting means for converting an output signal of said frequency converting means into a baseband signal;
offset voltage detecting means for detecting an offset voltage from the output signal of said frequency converting means during a given period; and
offset canceling means for canceling the offset voltage in the output signal of said frequency converting means during a period other than the given period, correspondingly to the offset voltage detected by said offset voltage detecting means,
when it is applied to a communication system of Frequency Division Multiplex Access method,
said offset voltage detecting means detects offset voltage during a period corresponding to a pilot signal part of a received frame, and
said offset canceling means supplies the offset canceling voltage sent from said offset canceling means to the output side of said frequency converting means during another period.

12. A direct conversion receiver as set forth in claim 10, wherein
said offset voltage detecting means fetches the output signal of said frequency converting means through one or more stage baseband amplifiers and detects offset voltage of the obtained output signal.

13. A direct conversion receiver comprising:
frequency mixing means for mixing a received radio frequency signal and a local oscillation frequency signal;
signal converting means for converting an output signal of said frequency mixing means into a baseband signal;
offset voltage detecting means for detecting an offset voltage from the output signal of said signal converting means;

offset canceling means for supplying offset canceling voltage for canceling offset voltage in the output signal of said frequency mixing means, correspondingly to the offset voltage detected by said offset voltage detecting means, so as to overlap the output signal of said frequency mixing means; and switching means for blocking a supply of the output signal of said offset voltage detecting means to said offset canceling means during a given period, and supplying the output signal of said offset voltage detecting means to said offset canceling means during a period other than the given period.

14. A direct conversion receiver as set forth in claim 13, wherein when it is applied to a communication system of Time Division Multiplex Access method, said switching means blocks the supply of the output signal of said offset voltage detecting means to said offset canceling means during a period other than an assigned time slot of the present receiver, and supplies the output signal of said offset voltage detecting means to said offset canceling means during a period of the assigned time slot of the present receiver.

15. A direct conversion receiver as set forth in claim 13, wherein when it is applied to a communication system of Frequency Division Multiplex Access method, said switching means blocks the supply of the output signal of said offset voltage detecting means to said offset canceling means during a period corresponding to a pilot signal part of a received frame, and supplies the output signal of said offset voltage detecting means to said offset canceling means during the other period.

16. A direct conversion receiver as set forth in claim 13, wherein said offset voltage detecting means comprising delta-sigma modulating means receiving the output of said frequency mixing means for delta-sigma modulation, and averaging means for averaging the output signal delta-sigma modulated by said delta-sigma modulating means, said delta-sigma modulating means being a first or more delta-sigma modulator.

17. A direct conversion receiver as set forth in claim 13, wherein said offset voltage detecting means comprising delta-sigma modulating means receiving the output of said frequency mixing means for delta-sigma modulation, and averaging means for averaging the output signal delta-sigma modulated by said delta-sigma modulating means, said delta-sigma modulating means being a MASH typed delta-sigma modulator.

18. A direct conversion receiver as set forth in claim 11, wherein said offset voltage detecting means fetches the output signal of said frequency converting means through one or more stage baseband amplifiers and detects offset voltage of the obtained output signal.

* * * * *